US010292320B2

(12) United States Patent
Kelaher et al.

(10) Patent No.: US 10,292,320 B2
(45) Date of Patent: May 14, 2019

(54) INTERNAL PCI ADAPTER CARD CARRIER

(71) Applicant: Internaitonal Business Machines Corporation, Armonk, NY (US)

(72) Inventors: Daniel P. Kelaher, Holly Springs, NC (US); Derek I. Schmidt, Raleigh, NC (US); James S. Womble, Hillsborough, NC (US)

(73) Assignee: International Business Machines Corporation, Armonk, NY (US)

( * ) Notice: Subject to any disclaimer, the term of this patent is extended or adjusted under 35 U.S.C. 154(b) by 229 days.

(21) Appl. No.: 14/856,459

(22) Filed: Sep. 16, 2015

(65) Prior Publication Data

US 2016/0007511 A1    Jan. 7, 2016

Related U.S. Application Data

(62) Division of application No. 12/835,683, filed on Jul. 13, 2010, now abandoned.

(51) Int. Cl.
*H05K 13/04* (2006.01)
*H01R 13/62* (2006.01)
*H01R 12/70* (2011.01)
*H01R 43/26* (2006.01)
*H05K 7/14* (2006.01)
(Continued)

(52) U.S. Cl.
CPC ......... *H05K 13/0447* (2013.01); *G06F 1/185* (2013.01); *G06F 1/186* (2013.01); *H01R 12/7005* (2013.01); *H01R 13/62* (2013.01); *H01R 43/26* (2013.01); *H05K 7/1415* (2013.01); *H05K 7/1461* (2013.01); *H05K 13/0015* (2013.01); *H05K 13/046* (2013.01);
(Continued)

(58) Field of Classification Search
CPC ............. H05K 13/0015; H05K 13/046; H05K 13/0447; H05K 7/1461; H05K 7/1415; G06F 1/185; G06F 1/186; Y10T 29/53261; Y10T 29/5313; Y10T 29/49895
See application file for complete search history.

(56) References Cited

U.S. PATENT DOCUMENTS

| | | | |
|---|---|---|---|
| 1,367,362 | A | 2/1921 | Earnhart |
| 3,662,224 | A | 5/1972 | Rauch |

(Continued)

OTHER PUBLICATIONS

Final Office Action U.S. Appl. No. 12/835,683, dated Oct. 30, 2015.
(Continued)

*Primary Examiner* — Peter DungBa Vo
*Assistant Examiner* — Jeffrey T Carley
(74) *Attorney, Agent, or Firm* — Zilka-Kotab, P.C.

(57) ABSTRACT

According to one embodiment, a method for placing an adapter card on a system board of a computer system includes, aligning a tool having an adapter card secured therewith to a slot on a system board of a computer system using a positioning member, and seating the adapter card into the slot on the system board. The tool includes a carrier for supporting the adapter card, at least one lower retaining member extending from a lower portion of the carrier for securing the adapter card to the carrier, at least one upper retaining member extending from an upper portion of the carrier for securing the adapter card to the carrier, and the positioning member coupled to the carrier.

11 Claims, 6 Drawing Sheets

(51) Int. Cl.
*G06F 1/18* (2006.01)
*H05K 13/00* (2006.01)

(52) U.S. Cl.
CPC ...... *Y10T 29/49895* (2015.01); *Y10T 29/5313* (2015.01); *Y10T 29/53261* (2015.01)

(56) References Cited

U.S. PATENT DOCUMENTS

| | | | |
|---|---|---|---|
| 4,223,934 A | 9/1980 | Cauceglia et al. | |
| 4,858,309 A | 8/1989 | Korsunsky et al. | |
| 5,265,328 A | 11/1993 | Gorman | |
| 5,754,406 A | 5/1998 | Hardt et al. | |
| 6,062,894 A | 5/2000 | Barringer | |
| 6,195,259 B1 | 2/2001 | Whitman et al. | |
| 6,496,385 B1 | 12/2002 | Smithson et al. | |
| 6,545,877 B1 * | 4/2003 | Agha | H05K 7/1417 361/759 |
| 6,552,915 B2 | 4/2003 | Takahashi et al. | |
| 7,140,900 B1 | 11/2006 | Villanueva | |
| 7,264,512 B2 | 9/2007 | Wolford et al. | |
| 7,303,412 B1 | 12/2007 | Liao | |
| 7,420,812 B2 | 9/2008 | Chen et al. | |
| 7,420,816 B2 | 9/2008 | Rubenstein | |
| 7,458,144 B2 | 12/2008 | Barina et al. | |
| 7,913,379 B2 | 3/2011 | Bodenweber et al. | |
| 2005/0071982 A1 | 4/2005 | Ferguson et al. | |
| 2008/0123274 A1 | 5/2008 | Desrosiers et al. | |
| 2009/0172235 A1 | 7/2009 | Yan et al. | |
| 2009/0211083 A1 | 8/2009 | Bodenweber et al. | |
| 2012/0011700 A1 | 1/2012 | Kelaher et al. | |
| 2016/0150686 A1 | 5/2016 | Kelaher et al. | |

OTHER PUBLICATIONS

Restriction Requirement U.S. Appl. No. 12/835,683, dated Jan. 9, 2013.
Non-Final Office Action U.S. Appl. No. 12/835,683, dated Jan. 31, 2013.
Final Office Action U.S. Appl. No. 12/835,683, dated Jun. 11, 2013.
Non-Final Office Action U.S. Appl. No. 12/835,683, dated Apr. 9, 2015.
Kelaher et al., U.S. Appl. No. 12/835,683, filed Jul. 13, 2010.
Kelaher et al., U.S. Appl. No. 15/012,647, filed Feb. 1, 2016.
Non-Final Office Action from U.S. Appl. No. 15/012,647, dated Jun. 18, 2018.
Final Office Action from U.S. Appl. No. 15/012,647, dated Dec. 14, 2018.
Advisory Action from U.S. Appl. No. 15/012,647, dated Mar. 14, 2019.

\* cited by examiner

INTERNAL PCI ADAPTER CARD CARRIER

BACKGROUND

The density of the placement of internal components in server computers has rapidly increased in response to the demands for increased performance of the server computers. This increase in component density has led to a near-overcrowding condition in many server computer boxes. Therefore, further optimization of server components and server component placement (and to a lesser extent desktop and workstation computers) is dictated in order to satisfy the demands for more performance from these computers.

Recently, in an attempt to satisfy this need, system designers have started providing connectors for adapter cards inside the middle of the system; whereas they have typically been installed in the rear of systems. Indeed, the peripheral component interconnect (PCI) specification that governs the design of adapter cards specifies features that mate and interface with the rear system chassis walls. However, these mounting features are typically not adequate for installation of these cards internally in server computers. Additionally, structural support for these cards does not exist when they are installed internal to the computer rather than at a chassis wall.

For these PCI cards which are not mounted next to the rear system walls, there is an additional need for a method to handle the card to aid in the installation and removal of the card within the constraints of the adjacent system hardware. Although several attempts have been made in the industry that help in the installation, removal, and retention of adapter cards in the rear of a system (near a rear wall of the chassis), none has been identified that applies to cards installed internally to the system.

SUMMARY

According to one embodiment, a method for placing an adapter card on a system board of a computer system includes aligning a tool having an adapter card secured therewith to a slot on a system board of a computer system using a positioning member and seating the adapter card into the slot on the system board. The tool includes a carrier for supporting the adapter card, at least one lower retaining member extending from a lower portion of the carrier for securing the adapter card to the carrier, at least one upper retaining member extending from an upper portion of the carrier for securing the adapter card to the carrier, and the positioning member coupled to the carrier.

Other aspects and embodiments of the present invention will become apparent from the following detailed description, which, when taken in conjunction with the drawings, illustrate by way of example the principles of the invention.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

According to one general embodiment, a tool includes a carrier for supporting an adapter card, at least one lower retaining member extending from a lower portion of the carrier for securing the adapter card to the carrier, and at least one upper retaining member extending from an upper portion of the carrier for securing the adapter card to the carrier. The carrier is adapted to securely hold the adapter card during movement of the carrier and during placement of the adapter card in a computer system.

In another general embodiment, a system includes a tool and a computer system chassis having a feature for aligning the tool with a system board of the computer system. The tool includes a carrier for supporting an adapter card, at least one lower retaining member extending from a lower portion of the carrier for securing the adapter card to the carrier, at least one upper retaining member extending from an upper portion of the carrier for securing the adapter card to the carrier, and a positioning member extending from the carrier for aligning the tool. The carrier is adapted to securely hold the adapter card during movement of the carrier and during placement of the adapter card in a computer system.

According to one general embodiment, a method for placing an adapter card on a system board of a computer system includes aligning a tool having an adapter card secured therewith to a slot on a system board of a computer system using a positioning member and seating the adapter card into the slot on the system board. The tool includes a carrier for supporting the adapter card, at least one lower retaining member extending from a lower portion of the carrier for securing the adapter card to the carrier, at least one upper retaining member extending from an upper portion of the carrier for securing the adapter card to the carrier, and the positioning member coupled to the carrier.

As used herein, an "adapter card" is meant to mean any card, circuit, circuit board, etc., having circuitry thereon or therein that is insertable in a slot in a computer system.

Figure 1:
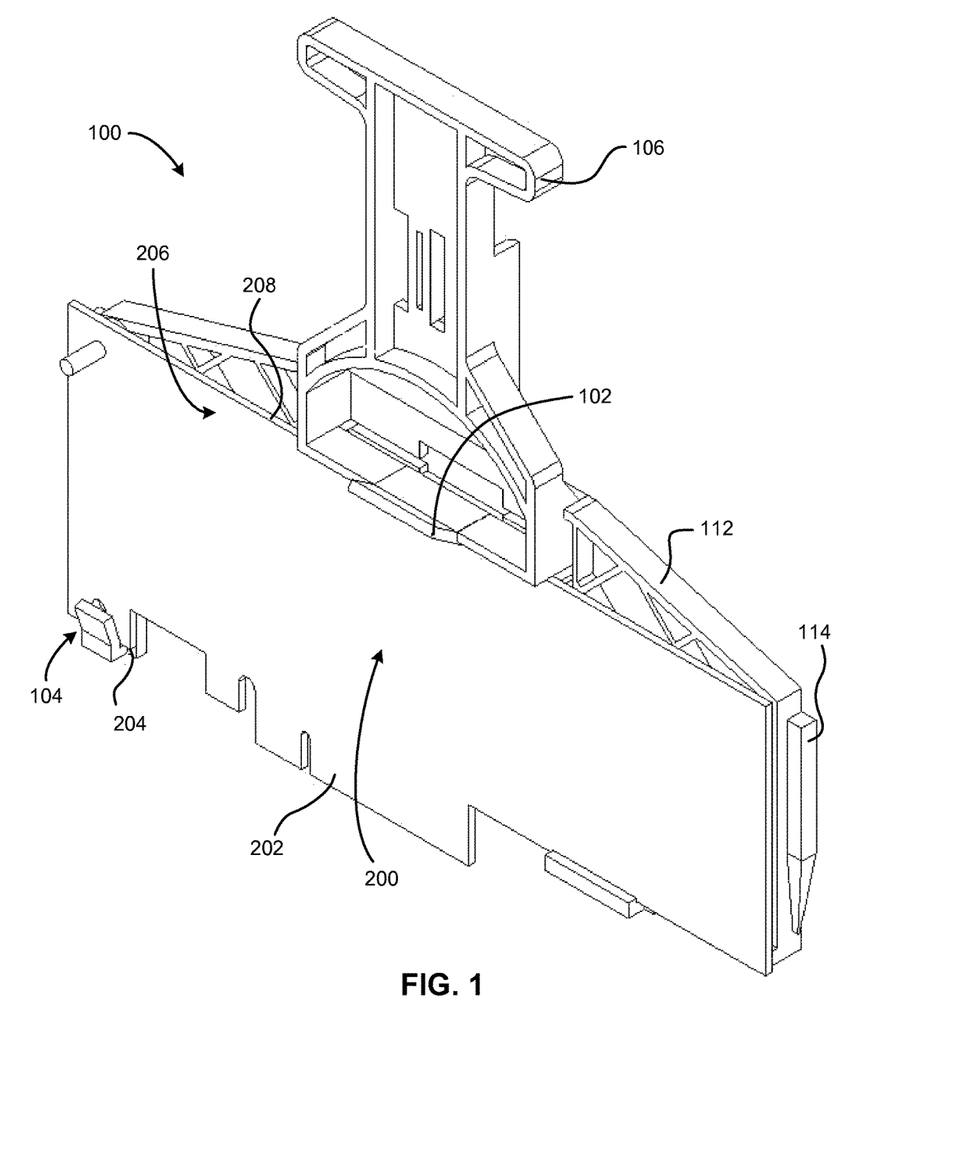
FIG. 1 shows an isometric view of a tool, according to one embodiment.

According to one embodiment, the adapter card may have a rear input/output (I/O) bracket removed, since the bracket, per peripheral component interconnect (PCI) specification, travels below the level of the system board into which the adapter card is inserted, in some embodiments. The adapter card 200 may also be installed onto a tool 100, as shown in FIG. 1, according to one embodiment. A bottom portion 202 of the adapter card 200, and particularly a bottom edge 204 of the adapter card 200, may be placed in a lower retaining member 104 of a carrier 112 of the tool 100, in one approach. The lower retaining member 104 may be a slot, a groove, a protruding member, etc., or any other feature which is able to hold at least a portion of the adapter card 200 in place during movement of the tool 100 in one direction (e.g., up, down, etc.), and preferably in all directions, according to several embodiments. Also, in one approach, a top portion 206 of the adapter card 200 may be rotated upward so that the adapter card 200 is about parallel with the tool 100, and so that a top edge 208 of the adapter card 200 is engaged by an upper retaining member 102 of a carrier 112 of the tool 100. The upper retaining member 102 may be a latch, a slot, a groove, a protruding member, etc., or any other feature which is able to hold at least a portion of the adapter card 200 in place during movement of the tool 100 in one direction (e.g., up, down, etc.), and preferably in all directions, according to several embodiments. Additionally, in some embodiments, the tool 100 may include a handle portion 106 for easier movement and/or positioning of the tool 100 and/or the adapter card 200.

In one embodiment, a tool 100 includes a carrier 112 for supporting an adapter card. The carrier 112 may have a height of at least about that of an adapter card 200, with the height being measured in a direction parallel to the adapter card 200 from an end of the adapter card 200 having electrical contacts thereon to the opposite end of the adapter card 200. The tool 100 may also include at least one lower retaining member 104 extending from a lower portion of the carrier 112 for securing the adapter card 200 to the carrier 112, and at least one upper retaining member 102 extending from an upper portion of the carrier 112 for securing the adapter card 200 to the carrier 112. The carrier 112 securely holds the adapter card 200 during movement of the carrier 112 and during placement of the adapter card 200 in a computer system.

Figure 4:
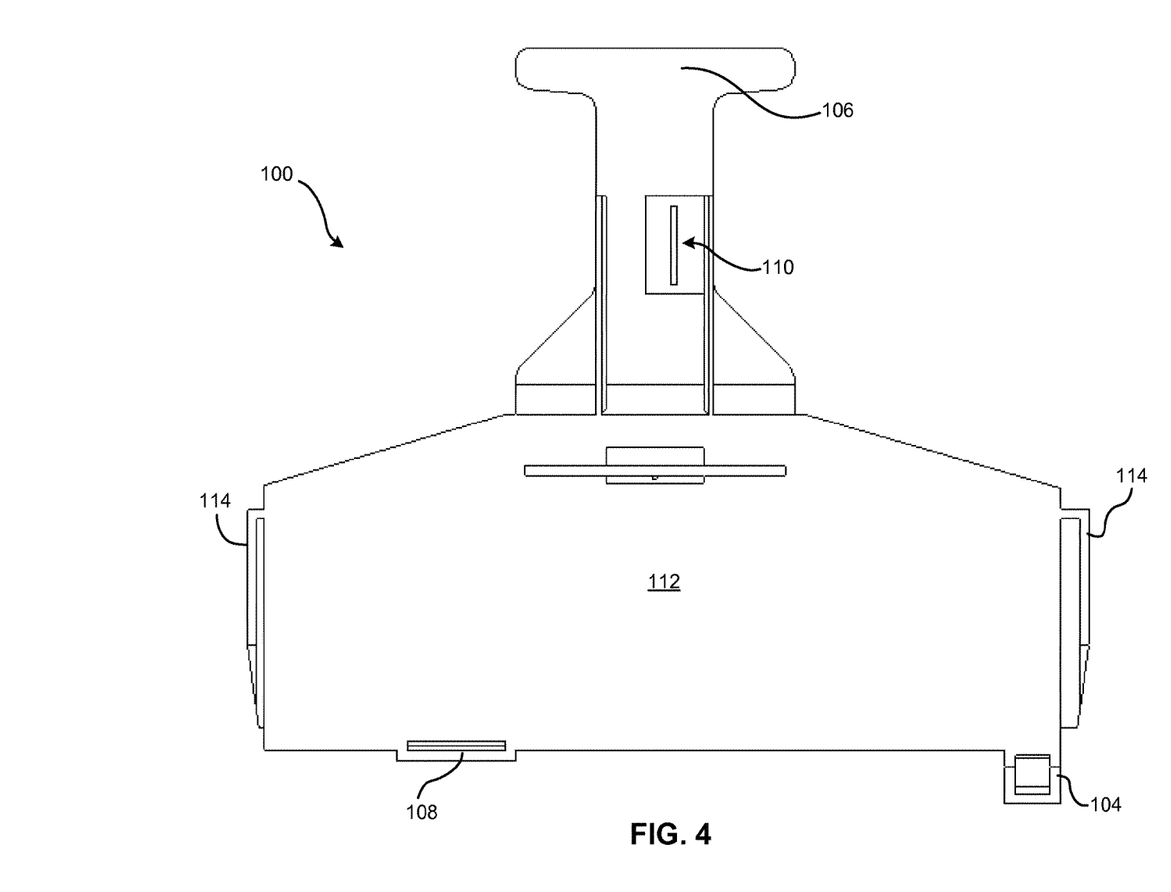
FIG. 4 is a schematic diagram of a rear view of a tool without an adapter card, according to one embodiment.
Figure 5:
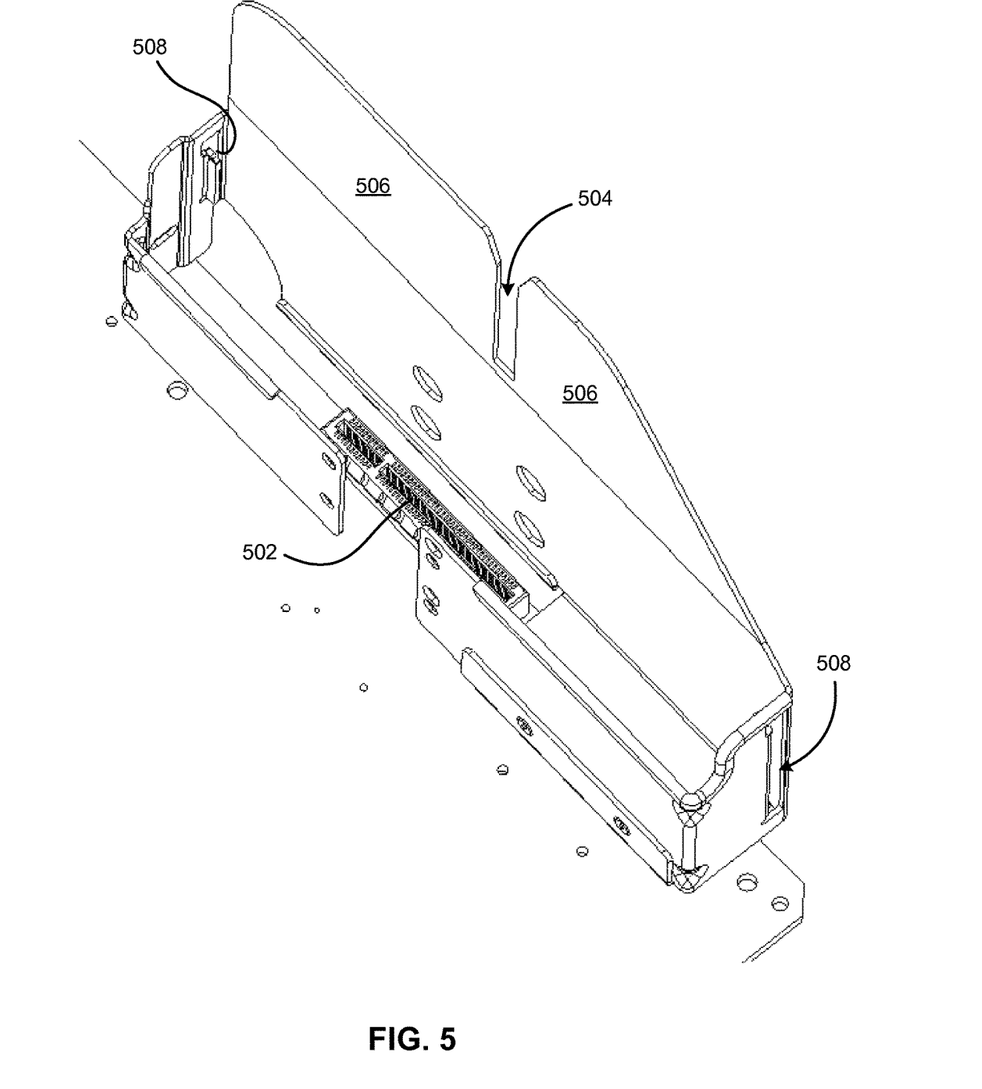
FIG. 5 shows a schematic diagram of a computer system with a chassis, according to one embodiment.

Referring to FIGS. 1, 4, and 5, in one approach, the tool 100 may also include a handle portion 106 coupled to the carrier 112 near or at the upper portion of the carrier 112. The handle portion 106 is for positioning the tool 100. The tool 100 may also include a positioning member 110 on at least one of the carrier 112 and the handle portion 106 for aligning the tool 100 with a chassis 506 in a computer system. In some further approaches, the positioning member 110 may extend from at least the carrier 112 or the handle portion 106 (as shown in FIG. 4), and the positioning member 110 may be engageable to a feature 504 of the chassis 506 in the computer system, as described in more detail below.

According to another embodiment, as shown in FIG. 1, the tool 100 may include side guides 114, which may be engageable with features 508 of the chassis 506 in the computer system. Of course, in addition to or in place of these guidance devices and/or members, any combination of member on the tool 100 and feature of the chassis 506 may be used to align the adapter card 200 with a connector on a system board 502.

In another approach, the at least one lower retaining member 104 may include a slot (as shown in FIG. 1) for securing the adapter card 200. The slot may provide unilateral and univertical resistance of movement for the adapter card 200. In other words, the slot may inhibit the adapter card 200 from moving downward and from moving side-to-side in a latitudinal direction of the tool 100.

In another embodiment, the at least one upper retaining member 102 may include either a latch or a clip for securing the adapter card 200, wherein the latch or clip is positionable to allow the adapter card 200 to be secured to the carrier 112.

In one embodiment, the tool 100 may also include at least one lateral retaining member positioned at or near a side portion of the carrier 112 for securing the adapter card 200 to the carrier 112. For example, a protruding member may be insertable into and/or through the adapter card 200 for retaining the adapter card 200.

Figure 2:
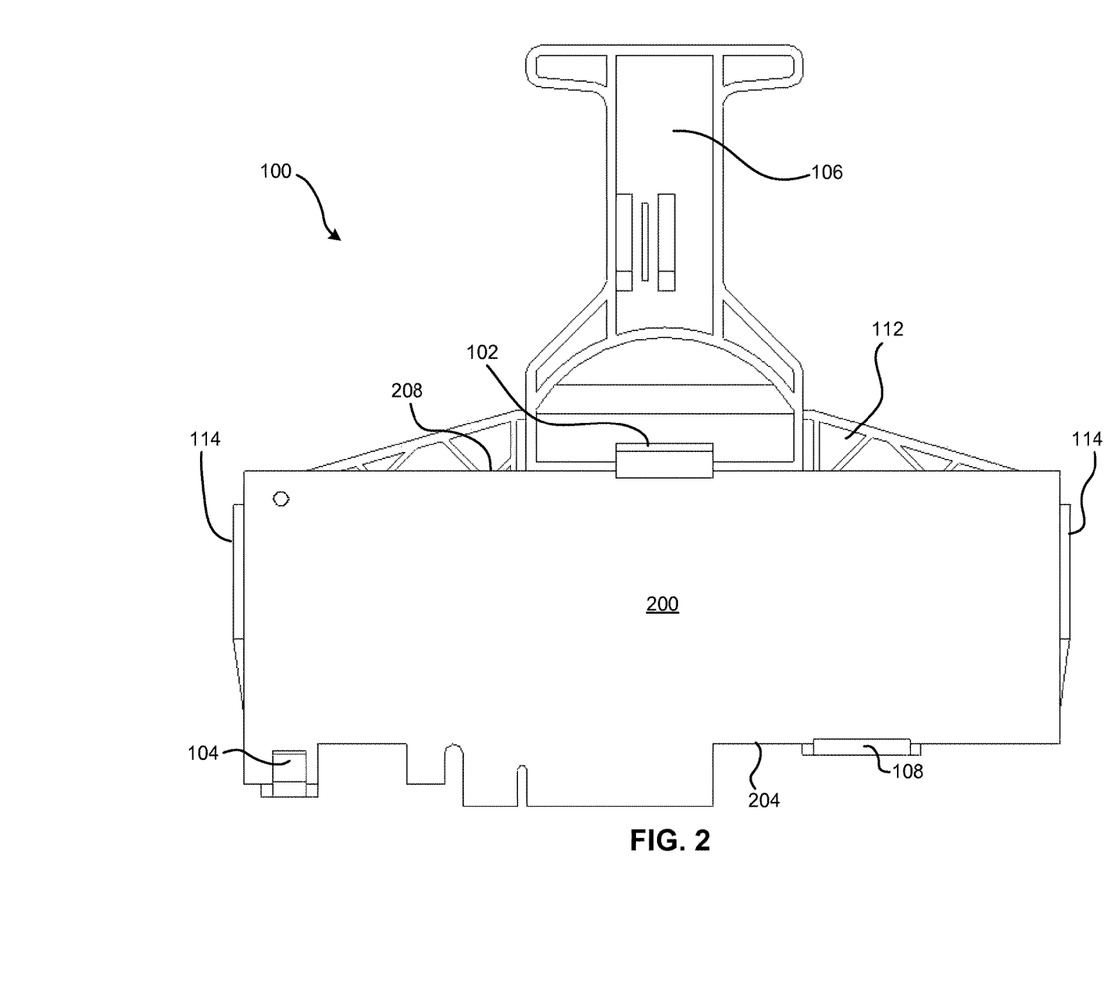
FIG. 2 is a schematic diagram of a tool and an adapter card, according to one embodiment.

Now referring to FIG. 2, a schematic diagram shows the adapter card 200 as it is installed in the tool 100, according to one embodiment. As can be seen from FIG. 2, the tool 100 may include ribbing, structural members, or any other feature as would be known to one of skill in the art to provide additional support and/or rigidity to the tool 100, according to one embodiment. The handle portion 106 of the tool 100 may be wider near an upper portion than it is near a lower portion, thereby allowing for easier gripping by a user of the tool 100, according to one embodiment.

Also, as can be seen in FIG. 2, the lower retaining member 104, which is shown retaining the lower edge 204 of the adapter card 200, may be aided by one or more additional lower retaining members 108, which may be similar in design to the lower retaining member 104 or may be differently constructed. For example, the one or more lower retaining members 104, 108 may be a ledge on which the adapter card 200 rests, a slot into which the adapter card 200 fits, a ridge which interacts with a portion of the adapter card 200, etc.

With continued reference to FIG. 2, the upper retaining member 102 can be seen gripping an upper portion and upper edge 208 of the adapter card 200, according to one embodiment. The upper retaining member 102 may also be aided by additional upper retaining members (not shown), in some embodiments.

Figure 3:
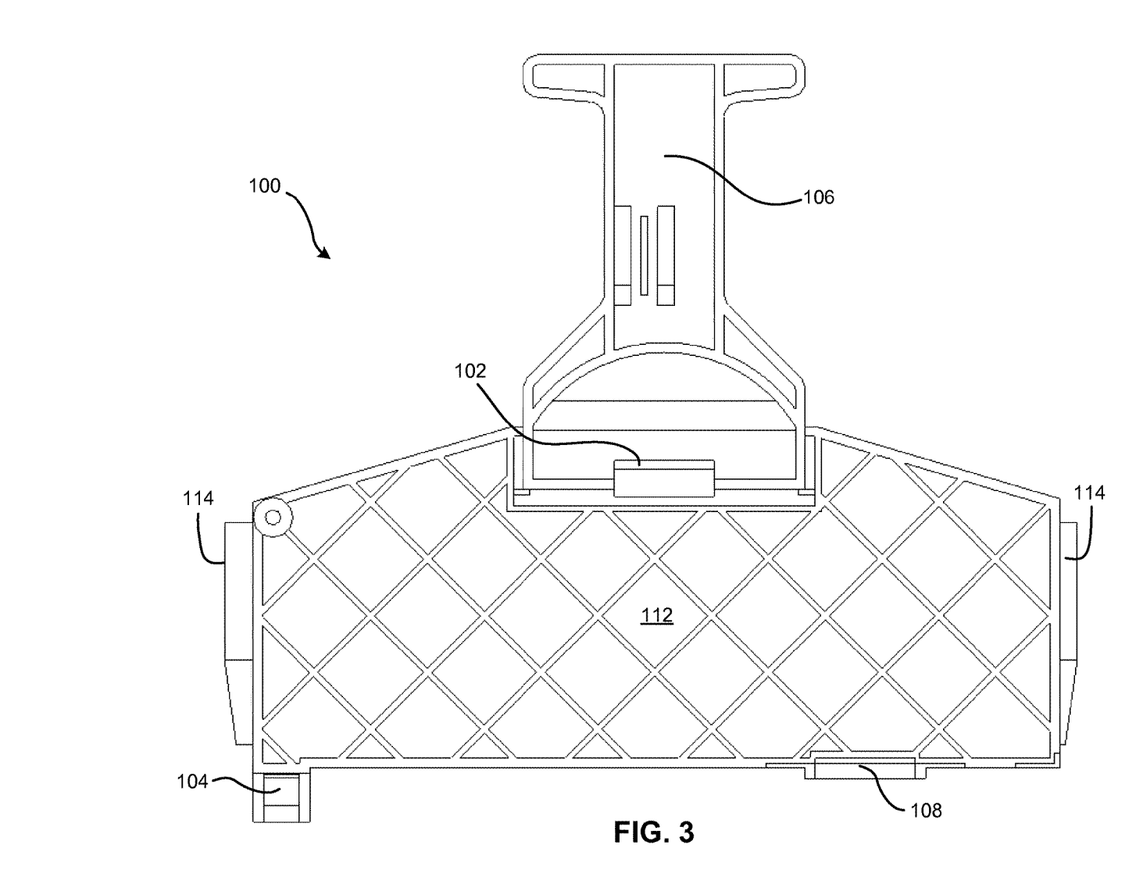
FIG. 3 is a schematic diagram of a front view of a tool without an adapter card, according to one embodiment.

In FIG. 3, a schematic diagram of a front side of the tool 100 is shown without an adapter card installed, according to one embodiment. As can be seen in FIG. 3, the lower retaining member 104 can be clearly seen, and in the embodiment shown in FIG. 3, it is a slot into which the adapter card may slide. In addition, an additional lower retaining member 108 is shown, according to one embodiment, as a ledge onto which an adapter card may rest. Also seen in FIG. 3 is the upper retaining member 102, which in this embodiment, is shown as a latch which is positionable such that an adapter card may be installed and removed from the tool 100. In addition, the tool 100 is shown with a handle portion 106 which may be used to position the tool 100, with or without an adapter card installed, according to some embodiments.

In FIG. 4, a schematic diagram of a rear side of the tool 100 is shown without an adapter card installed, according to one embodiment. As can be seen in FIG. 4, the lower retaining member 104 can be seen, but portions thereof are obscured by the tool 100. Also seen in FIG. 4 is the handle portion 106 which may be used to position the tool 100, with or without an adapter card installed, according to some embodiments. Also indicated in FIG. 4 is a positioning member 110, which may be used to position the tool 100 with respect to a chassis, wall, or any other member of a computer system into which an adapter card 200 held by the tool 100 is to be installed. As shown in FIG. 4, the positioning member 110 is a T-shaped member defining at least one lateral slot, but any member, as would be known to one of skill in the art may be used, such as a ridge, a tab, a groove, a physical indicator, etc. In preferred embodiments, the positioning member 110 may be designed such that it aligns with one or more features of a computer system into which an adapter card 200 is to be installed, and/or the positioning member 110 may be engageable with one or more features of a computer system into which an adapter card 200 is to be installed.

Now referring to FIGS. 4-5, in one embodiment, the positioning member 110 on the rear side of the tool 100 may engage into a slot 504 on a chassis 506 of a computer system to ensure that the card (which is being held by the tool 100) is aligned with a connector on a system board 502, while the card is slid downwards into the computer system. In this way, a simple vertical push down on the handle portion 106 of the tool 100 may seat the adapter card 200 into the slot on the system board 502, according to one embodiment.

In another embodiment, removal of a card from a computer system may also be aided by the use of a tool. Referring to FIGS. 3-5, removal of a card from a computer system, according to one embodiment, may involve engaging a tool 100 with a card 200, lifting up on the handle portion 106 of the tool 100 while it is in the computer system, and compelling the card 200 to become disengaged from the connector on the system board 502. Then, in a continuing embodiment, with the card 200 still held in the tool 100, a user may push against the upper retaining member 102, rotate the card 200 away from the tool 100, and disengage the card 200 from the lower retaining member 104.

In another embodiment, referring to FIGS. 1-5, a system includes a tool 100 and a computer system chassis 506 having a feature 504 for aligning the tool 100 with a system board 502 of the computer system. The tool 100 includes a carrier 112 for supporting an adapter card, at least one lower retaining member 104 extending from a lower portion of the carrier 112 for securing the adapter card 200 to the carrier 112, at least one upper retaining member 102 extending from an upper portion of the carrier 112 for securing the adapter card 200 to the carrier 112, and a positioning member 110 extending from the carrier 112 for aligning the tool 100. The carrier 112 may have a width and a height similar to that of an adapter card 200, only a width similar to that of the adapter card 200, only a height similar to that of the adapter card 200, or may have dimensions independent of the adapter card 200.

In a further embodiment, the carrier 112 may comprise a handle portion 106 at or near the upper portion of the carrier 112. The handle portion 106 is for positioning the tool 100.

In one approach, the positioning member 110 may be engageable with the feature 504 of the computer system chassis 506. In another approach, the at least one lower retaining member 104 may include a slot for securing the adapter card 200, and the slot may provide unilateral and univertical resistance of movement for the adapter card 200. In other words, the slot may inhibit movement of the adapter card 200 in the downward and sideway directions in the latitudinal tool direction.

In another embodiment, the at least one upper retaining member 102 may include either a latch or a clip for securing the adapter card 200, and the latch or clip may be positionable to allow the adapter card 200 to be secured to the carrier 112.

According to another approach, the tool 100 may also include at least one lateral retaining member positioned at or near a side portion of the carrier 112 for securing the adapter card 200 to the carrier 112.

Figure 6:
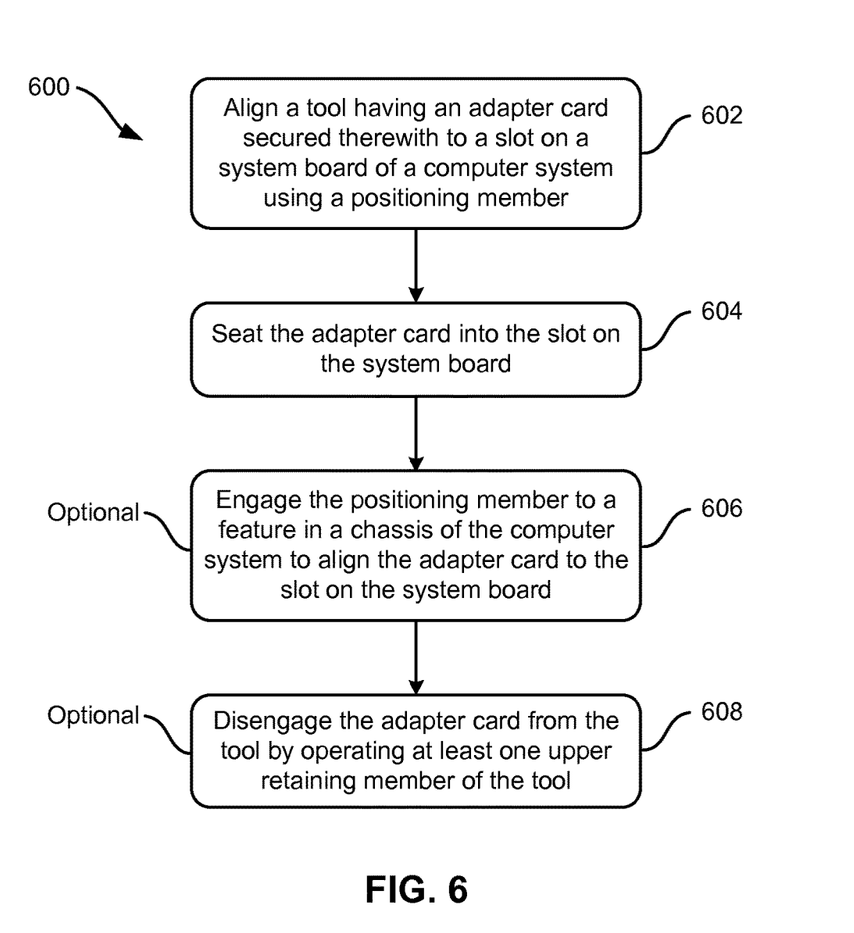
FIG. 6 shows a method for placing an adapter card on a system board of a computer system, according to one embodiment.

Now referring to FIG. 6, a method 600 for placing an adapter card on a system board of a computer system is shown according to one embodiment. The method may be performed in any desired environment, and may include some descriptions and embodiments included herein. Of course, additional operations may be performed in addition to those described below.

In operation 602, a tool having an adapter card secured therewith is aligned to a slot on a system board of a computer system using a positioning member.

In operation 604, the adapter card is seated into the slot on the system board.

The tool includes a carrier for supporting the adapter card, at least one lower retaining member extending from a lower portion of the carrier for securing the adapter card to the carrier, at least one upper retaining member extending from an upper portion of the carrier for securing the adapter card to the carrier, and the positioning member coupled to the carrier for aligning the tool. The carrier may have a height similar to that of the adapter card.

In one approach, the tool may also include a handle portion coupled to the carrier at or near the upper portion of the carrier, and the handle portion may be for positioning the tool.

In more approaches, the at least one lower retaining member may include a slot for securing the adapter card. The slot may resist movement of the adapter card in the downward and sideway directions.

In additional embodiments, the at least one upper retaining member may include either a latch or a clip for securing the adapter card. The latch or clip may be positionable to allow the adapter card to be secured to the carrier.

In another approach, the tool may also include at least one lateral retaining member positioned at or near a side portion of the carrier for securing the adapter card to the carrier.

In one approach, the method 600 may further include optional operation 606, where the adapter card is disengaged from the tool by operating at least one upper retaining member of the tool.

In another embodiment, the adapter card may remain secured to the tool after being seated into the slot on the system board.

In one approach, the method 600 may further include optional operation 608, where the positioning member is engaged to a feature in a chassis of the computer system to align the adapter card to the slot on the system board.

Also, systems may implement and include additional embodiments and approaches not specifically described herein, but would be apparent to one of skill in the art, without departing from the scope of the invention.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method for placing an adapter card on a system board of a computer system, the method comprising:
   aligning a tool having an adapter card secured therewith to a first slot on a system board of a computer system using a positioning member; and
   seating the adapter card into the first slot on the system board,
   wherein the tool comprises:
   a carrier for supporting the adapter card;
   at least one lower retaining member extending from a lower portion of the carrier for securing the adapter card to the carrier;
   at least one upper retaining member extending from an upper portion of the carrier for securing the adapter card to the carrier; and
   the positioning member coupled to the carrier;

wherein the positioning member is configured to engage a feature of the computer system and prevent movement of the adapter card in a horizontal direction while seating the adapter card into the first slot; and wherein the feature is a vertical slot formed in a chassis of the computer system.

2. The method as recited in claim 1, comprising disengaging the adapter card from the tool by operating the at least one upper retaining member of the tool.

3. The method as recited in claim 1, wherein the tool further comprises a handle portion coupled to the carrier at or near the upper portion of the carrier, wherein the handle portion is for positioning the tool.

4. The method as recited in claim 1, comprising engaging the positioning member to the feature to align the adapter card to the first slot on the system board in the horizontal direction.

5. The method as recited in claim 1, wherein the at least one lower retaining member includes a second slot for securing the adapter card, wherein the second slot resists movement of the adapter card in a vertical direction and a sideways direction.

6. The method as recited in claim 1, wherein the at least one upper retaining member includes either a latch or a clip for securing the adapter card at an edge of the adapter card facing away from the system board of the computer, wherein the at least one lower retaining member engages the adapter card at a lowermost edge of the adapter card that is directly facing the system board of the computer.

7. The method as recited in claim 1, wherein the tool further comprises at least one lateral retaining member positioned at or near a side portion of the carrier for securing the adapter card to the carrier in a vertical direction and the horizontal direction.

8. The method as recited in claim 1, wherein the adapter card remains secured to the tool after being seated into the first slot on the system board.

9. The method as recited in claim 1, wherein the tool comprises at least one side guide positioned on one or more side portions of the carrier, wherein the at least one side guide is configured to engage a second feature of the chassis to align the adapter card with the first slot in a sideways direction.

10. The method as recited in claim 1, comprising engaging at least one side guide of the tool to a second feature of the chassis to align the adapter card with the first slot in a sideways direction.

11. The method as recited in claim 1, comprising:
disengaging the adapter card from the tool after seating the adapter card into the first slot.

* * * * *